US006255846B1

(12) United States Patent
Lee et al.

(10) Patent No.: US 6,255,846 B1
(45) Date of Patent: *Jul. 3, 2001

(54) PROGRAMMABLE LOGIC DEVICES WITH ENHANCED MULTIPLEXING CAPABILITIES

(75) Inventors: Andy L. Lee, San Jose; Christopher F. Lane, Campbell; Bruce B. Pedersen, San Jose, all of CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/519,314

(22) Filed: Mar. 6, 2000

Related U.S. Application Data

(63) Continuation of application No. 09/081,885, filed on May 19, 1998, now Pat. No. 6,084,427.
(60) Provisional application No. 60/062,475, filed on Oct. 16, 1997.

(51) Int. Cl.[7] .................................................. G06F 7/38

(52) U.S. Cl. ................................ 326/39; 326/38; 326/41

(58) Field of Search .................................. 326/38, 39, 41

(56) References Cited

U.S. PATENT DOCUMENTS

| Re. 34,363 | 8/1993 | Freeman | 307/465 |
|---|---|---|---|
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra | 307/465 |

(List continued on next page.)

FOREIGN PATENT DOCUMENTS

| 454352 A1 | 10/1991 | (EP) | H03K/19/177 |
|---|---|---|---|
| 463746 A2 | 1/1992 | (EP) | G06F/15/60 |
| 630115 A2 | 12/1994 | (EP) | H03K/19/177 |
| 746105 A2 | 12/1996 | (EP) | H03K/19/177 |
| 2300950 | 11/1996 | (GB) | H03K/19/177 |
| 2311885 | 10/1997 | (GB) | H03K/19/177 |
| WO 95/04404 | 2/1995 | (WO) | H03K/19/177 |
| WO 95/22205 | 8/1995 | (WO) | H03K/19/177 |
| WO 95/30952 | 11/1995 | (WO) | G06F/7/38 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

Recent Developments in Switching Theory, A. Mukhopadhyay, ed., Academic Press, New York, 1971, chapters VI and IX, pp. 229–254, and 369–422.

*The Programmable Gate Array Data Book*, 1988, Xilinx, Inc., San Jose, CA.

El Gamal et al., "An Architecture for Electrically Configurable Gate Arrays," IEEE Journal of Solid–State Circuits, vol. 24, No. 2, Apr. 1989, pp. 394–398.

(List continued on next page.)

*Primary Examiner*—Michael Tokar
*Assistant Examiner*—Anh Tran
(74) *Attorney, Agent, or Firm*—Fish & Neave; Robert R. Jackson; Pejman Sharifi

(57) ABSTRACT

Programmable logic modules on a programmable logic device each include a four-input look-up table circuit which can be programmed to allow the logic module to produce an output signal which can be any of a plurality of logical combinations of four input signals applied to the logic module. In addition, each logic module is augmented with additional circuitry that allows the logic module to be alternatively operated as a dynamic four-to-one multiplexer.

58 Claims, 7 Drawing Sheets

U.S. PATENT DOCUMENTS

| | | | |
|---|---|---|---|
| 4,713,792 | 12/1987 | Hartmann et al. | 364/900 |
| 4,758,745 | 7/1988 | Elgamal et al. | 307/465 |
| 4,774,421 | 9/1988 | Hartmann et al. | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,023,606 | 6/1991 | Kaplinsky | 340/825.8 |
| 5,073,729 | 12/1991 | Greene et al. | 307/465.1 |
| 5,121,006 | 6/1992 | Pedersen | 307/465 |
| 5,122,685 | 6/1992 | Chan et al. | 307/465.1 |
| 5,132,571 | 7/1992 | McCollum et al. | 307/465.1 |
| 5,144,166 | 9/1992 | Camarota et al. | 307/465.1 |
| 5,208,491 | 5/1993 | Ebeling et al. | 307/465 |
| 5,218,240 | 6/1993 | Camarota et al. | 307/443 |
| 5,220,214 | 6/1993 | Pedersen | 307/465 |
| 5,225,719 | 7/1993 | Agrawal et al. | 307/465 |
| 5,255,203 | 10/1993 | Agrawal et al. | 364/489 |
| 5,258,668 | 11/1993 | Cliff et al. | 307/465 |
| 5,260,610 | 11/1993 | Pederson et al. | 307/465 |
| 5,260,611 | 11/1993 | Cliff et al. | 307/465 |
| 5,274,581 | 12/1993 | Cliff et al. | 364/784 |
| 5,338,984 | 8/1994 | Sutherland | 307/465.1 |
| 5,350,954 | 9/1994 | Patel | 307/465 |
| 5,371,422 | 12/1994 | Patel et al. | 326/41 |
| 5,414,377 * | 5/1995 | Freidin | 326/41 |
| 5,442,306 | 8/1995 | Woo | 326/39 |
| 5,448,186 | 9/1995 | Kawata | 326/41 |
| 5,455,525 | 10/1995 | Ho et al. | 326/41 |
| 5,467,029 | 11/1995 | Taffe et al. | 326/41 |
| 5,469,003 | 11/1995 | Kean | 326/39 |
| 5,483,178 | 1/1996 | Costello et al. | 326/41 |
| 5,509,128 | 4/1996 | Chan | 395/311 |
| 5,600,264 | 2/1997 | Duong et al. | 326/39 |
| 5,689,195 | 11/1997 | Cliff et al. | 326/41 |
| 5,835,998 | 11/1998 | Pedersen et al. | 326/40 |
| 5,905,385 * | 5/1999 | Sharpe-geisher | 326/39 |
| 5,909,126 | 6/1999 | Cliff et al. | 326/41 |
| 5,963,049 | 10/1999 | Cliff et al. | 326/41 |
| 5,977,793 | 11/1999 | Reddy et al. | 326/41 |
| 5,999,016 | 12/1999 | McClintock et al. | 326/41 |
| 6,020,756 * | 2/2000 | New | 326/39 |

OTHER PUBLICATIONS

El–Ayat et al., "A CMOS Electrically Configurable Gate Array," IEEE Journal of Solid–State Circuits, vol. 24, No. 3, Jun. 1989, pp. 752–762.

*ACT Family Field Programmable Gate Array Databook,* Apr. 1992, Actel Corporation, Sunnyvale, CA, pp. 1–35 through 1–44.

*The Programmable Logic Data Book,* 1994, Xilinx, Inc., San Jose, CA, pp. 2–7, 2–12, and 2–13.

"XC5000 Logic Cell Array Family, Technical Data, Advance Information," Xilinx, Inc., Feb. 1995.

* cited by examiner

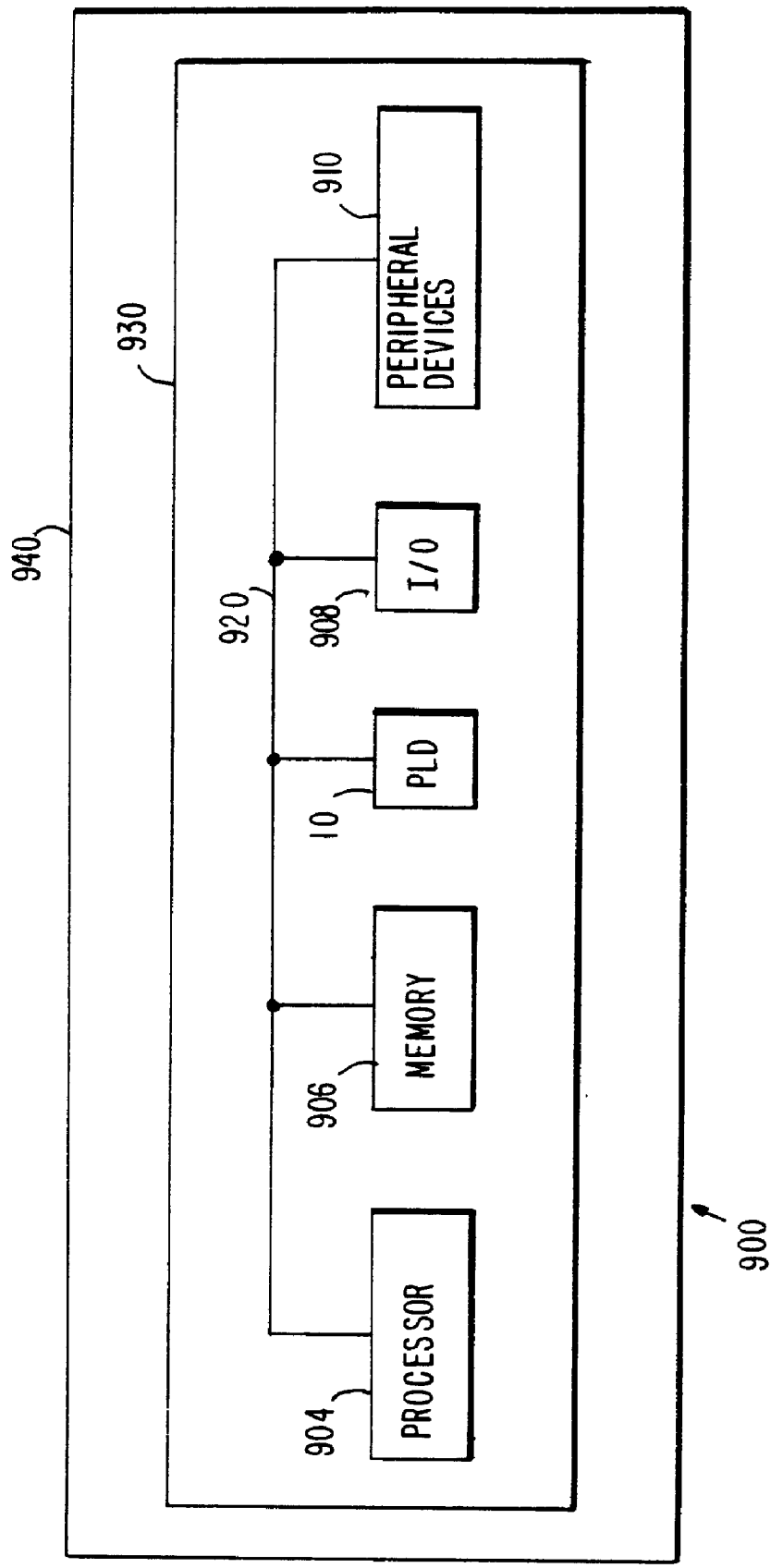

PROGRAMMABLE LOGIC DEVICES WITH ENHANCED MULTIPLEXING CAPABILITIES

This application is a continuation of U.S. patent application Ser. No. 09/081,885, filed May 19, 1998, U.S. Pat. No. 6,084,427, hereby incorporated by reference herein in its entirety, which claims the benefit of U.S. provisional patent application Ser. No. 60/062,475 filed Oct. 16, 1997.

BACKGROUND OF THE INVENTION

This invention relates to programmable logic devices, and more particularly to circuitry for improving the multiplexing capabilities of programmable logic devices.

Programmable logic devices are well known as shown, for example, by Cliff et al. U.S. Pat. No. 5,689,195, Cliff et al. U.S. Pat. No. 5,909,126, Cliff et al. U.S. Pat. No. 5,963,049, Reddy et al. U.S. Pat. No. 5,977,793, and McClintock et al. U.S. Pat. No. 5,999,016, all of which are hereby incorporated by reference herein. Such devices typically include large numbers of relatively small logic modules, each of which is programmable to perform any of several relatively elementary logic functions on input signals applied to the logic module in order to produce one or more logic module output signals. A network of programmable interconnection conductors and other interconnection resources is provided on the device for conveying signals to, from, and/or between the logic modules so that very complex logic functions can be performed by concatenating multiple logic modules in various ways.

The circuitry of known programmable logic devices performs logic very well, and it can also perform some multiplexing operations. (By "multiplexing" is meant the dynamic selection of any one of two or more multiplexer input signals to be the multiplexer output signal. In other words, at different times during operation of the device, a different one of the multiplexer input signals can be selected to be the multiplexer output signal.) However, known programmable logic devices tend not to perform multiplexing especially efficiently. For example, known logic modules which include a four-input look-up table may only be able to perform a single two-to-one multiplexing operation. Two of the inputs to the look-up table are used as the multiplexer input signals, a third input to the look-up table is used as a multiplexer selection control signal, and the fourth input to the look-up table may be wasted. Not only is this relatively inefficient use of a logic module, but in addition large numbers of logic modules must be used to perform wide fan-in multiplexing, and these modules must be connected in series (at least to some extent), which inherently slows down multiplexing functions.

In view of the foregoing, it is an object of this invention to provide programmable logic devices with improved multiplexing capabilities.

It is a more particular object of this invention to improve the speed, efficiency, and economy with which programmable logic devices can perform multiplexing operations.

SUMMARY OF THE INVENTION

These and other objects of the invention are accomplished in accordance with the principles of the invention by providing logic module circuitry that includes a programmable four-input look-up table and that is augmented with additional circuitry for allowing the logic module to be alternatively used as a dynamic four-to-one multiplexer.

In a first type of embodiment the four inputs to the look-up table are also applied to the four inputs of a four-to-one multiplexer circuit, and the final output signal of the logic module is programmably selected from either the look-up table output or the multiplexer output. The four-to-one multiplexer may be controlled by control signals which are shared with other logic modules on the programmable logic device that includes the first-mentioned logic module.

In another type of embodiment preliminary selection circuitry is used to select from more than four input signals the signals that are to be applied to the four-input look-up table. This preliminary selection circuitry may be controlled by inputs to the look-up table which are not among the signals being selected by the preliminary selection circuitry. Alternatively, this preliminary selection circuitry may be programmably controlled.

In still another type of embodiment four-to-one multiplexer circuitry is provided to select a multiplexer output signal from signals which have been either partly processed by the look-up table circuitry of the logic module or are raw inputs to the look-up table circuitry. The multiplexer circuitry is operated by additional inputs to the logic module.

As in the first-mentioned type of embodiment, various inputs to other types of logic modules in accordance with this invention can be shared by several logic modules on a programmable logic device. Such sharing by several logic modules is especially suitable for multiplexer selection control signals.

Further features of the invention, its nature and various advantages will be more apparent from the accompanying drawings and the following detailed description of the preferred embodiments.

BRIEF DESCRIPTION OF THE DRAWINGS

FIG. 7 is a simplified block diagram of an illustrative system employing a programmable logic device incorporating logic module circuitry in accordance with the invention.

DETAILED DESCRIPTION OF THE PREFERRED EMBODIMENTS

Figure 1:
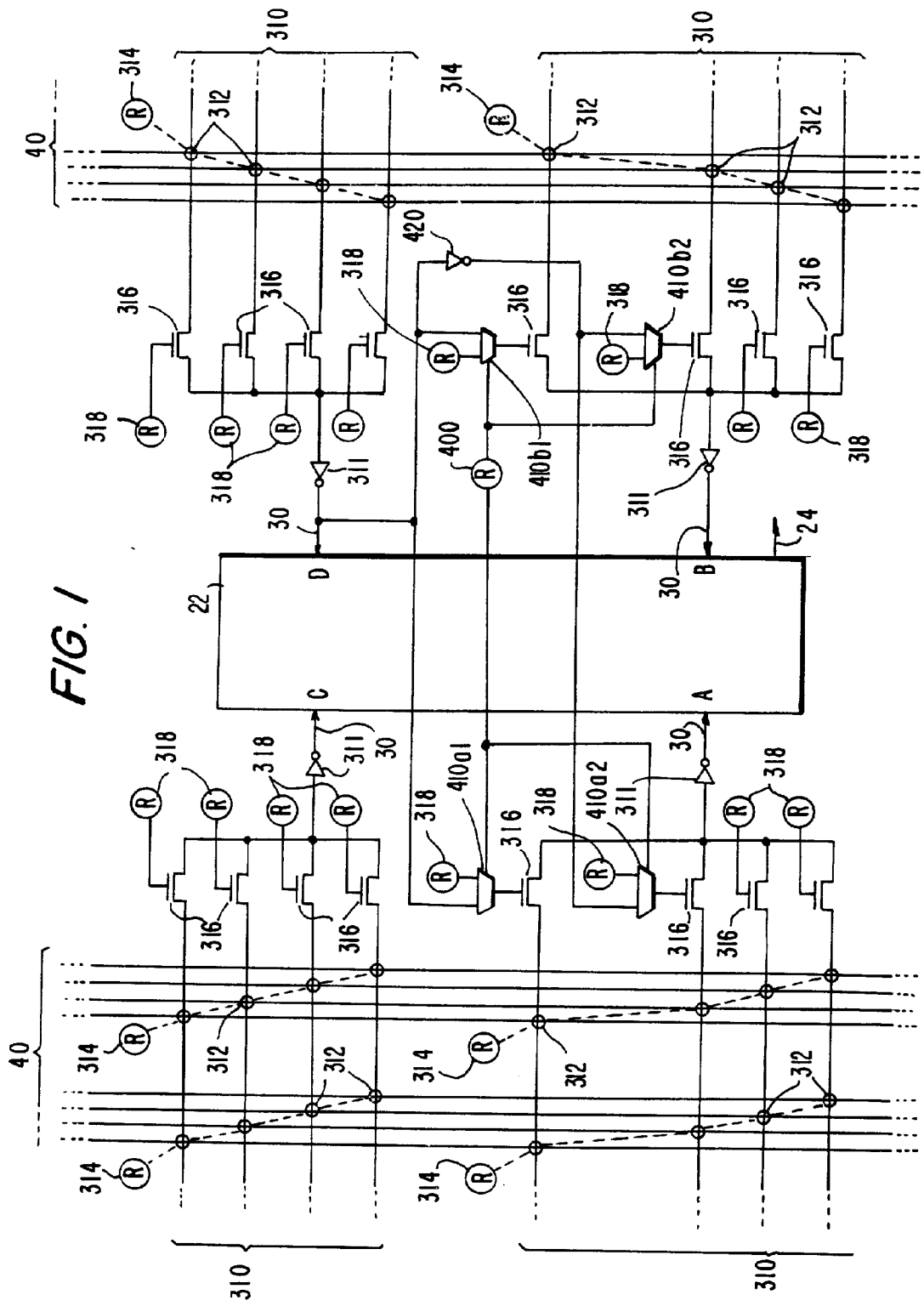
FIG. 1 is a simplified schematic block diagram of a representative portion of a programmable logic device constructed in accordance with the invention.

FIG. 1 shows a representative logic module 22 in a programmable logic device which can be constructed generally as shown in above-mentioned Cliff et al. U.S. Pat. No. 5,909,126. To facilitate reference to this Cliff et al. patent, the same reference numbers are used in FIG. 1 for elements that are the same as or at least generally similar to correspondingly numbered elements in the Cliff et al. patent. It will be understood, however, that this reference shows only some of the possible contexts for the FIG. 1 circuitry, and that embodiments of the type shown in FIG. 1 can be readily implemented in many other types of programmable logic devices.

Representative logic module 22 has four main data inputs A–D and a main data output 24. As is explained in more detail in Cliff et al. U.S. Pat. No. 5,909,126, logic module 22 may include a programmable four-input look-up table, a register for selectively registering the output signal of the look-up table, and programmable logic connectors ("PLCs") for allowing output 24 to be either the registered or unregistered output of the look-up table. Inputs A–D are the four inputs to the look-up table. The look-up table is programmable to produce an output signal which is any logical combination of the four inputs A–D.

Conductors 40 are part of an interconnection conductor network on the programmable logic device that includes the circuitry shown in FIG. 1. This network is provided for conveying signals to, from, and/or between logic modules (like logic module 22) on the device. Programmable function control elements ("FCEs") 314 (e.g., programmable random access memory ("RAM") cells) are provided for controlling PLCs 312 to selectively connect groups of four conductors 40 to groups of four conductors 310, one such group of four conductors 310 being respectively associated with each of inputs A–D. For example, appropriately programming one FCE 314 causes all four of the PLCs 312 associated with that FCE to connect the conductors 40 and 310 that intersect at those PLCS. PLCs 316 (controlled, in general, by FCEs 318) make the final selection of the signal to be applied to each input A–D from the group of four conductors 310 associated with that input A–D.

Considering, for example, input C, one of the PLCs 316 for the four conductors 310 associated with that input will typically be enabled by its FCE 318 so that the signal on the conductor 310 served by that PLC 316 will be applied to the associated inverter 311 and thus to the conductor 30 leading to input C. The three other PLCs 316 associated with input C will typically be disabled by their FCEs 318 to block the signals on the conductors 310 served by those PLCs.

Although, as will be discussed in more detail shortly, some of PLCs 316 can be alternatively controlled more dynamically by variable signals in the programmable logic device rather than by statically programmed FCEs 318, the generic term "PLC" will be used for all of elements 316 in the interest of simplicity. Other dynamically controllable logic connectors will also sometimes be referred to as PLCs throughout this specification and claims for similar reasons, it being understood that the term PLC is used to refer more to the type of circuit component that these elements are than to the manner in which they are controlled (i.e., whether they are statically ("programmably") or dynamically controlled).

FCE 400 controls whether the enhanced multiplexer circuitry of this invention that is shown in FIG. 1 is used. The state of FCE 400 controls which of the two inputs to each of PLCs 410a1, 410a2, 410b1, and 410b2 that PLC passes. Each of PLCs 410 may be thought of as a programmably controlled multiplexer. One input to each of PLCs 410 is an FCE 318 like all other FCEs 318 in FIG. 1. The other input to each PLC 410 is either the D input to logic module 22 or the inverted D input to the logic module, inversion being provided by inverter 420. If the enhanced multiplexer capability of this invention is not to be used, FCE 400 is programmed to cause all of PLCs 410 to pass their FCE 318 inputs. The FCEs 318 associated with inputs A and B therefore control the PLCs 316 associated with those inputs to make the final selection (from the associated conductors 310) of the signals applied to those inputs. In other words, in this case inputs A and B are selected in the same way that inputs C and D are selected.

On the other hand, if the enhanced multiplexer capability of this invention is to be used, then FCE 400 is programmed to cause all of PLCs 410 to pass their other inputs (i.e., logic module input D or inverted logic module input D). Logic module input D therefore controls which of the first two PLCs 316 associated with each of inputs A and B is enabled to pass to those inputs the signals on the conductors 310 served by those PLCs. For example, if input D is logic 1, the outputs of PLCs 410a1 and 410b1 will be logic 1, but the outputs of PLCs 410a2 and 410b2 will be logic 0. This causes the top-most PLC 316 associated with each of inputs A and B to pass to those inputs the signals on the top-most conductors 310 associated with those inputs. On the other hand, if input D is logic 0, then the outputs of PLCs 410a1 and 410b1 will be logic 0, but the outputs of PLCs 410a2 and 410b2 will be logic 1. This causes the next-to-top-most PLC 316 associated with each of inputs A and B to pass to those inputs the signals on the next-to-topmost conductors 310 associated with those inputs. Thus in enhanced multiplexer mode, input D controls selection of one of two signals for application to input A, and also controls selection of one of two more signals for application to input B. The look-up table in logic module 22 can then be programmed to cause input C to control selection of either input A or input B for output from the logic module via output lead 24. (As mentioned above, the output signal on lead 24 can be either registered or not registered by logic module 22.)

From the foregoing it will be appreciated that the circuitry shown in FIG. 1 can be operated as a four-to-one multiplexer. The four inputs to this multiplexer are the two upper leads 310 associated with each of inputs A and B. The selection control signals for the multiplexer are inputs C and D (although input D is actually used external to logic module 22 per se). Thus, with the addition of relatively little circuitry in accordance with this invention, logic module 22 (which previously could only function as a two-to-one multiplexer if multiplexing were needed) can now function as a four-to-one multiplexer. Moreover, all four inputs A–D to logic module 22 are used in the four-to-one multiplexer operation, and so there is no waste of resources as there is when a prior art logic module is used to perform two-to-one multiplexing and therefore only three of the four inputs to the logic module are used. In addition, if wide fan-in multiplexing is needed, fewer four-to-one multiplexers than two-to-one multiplexers must be connected in series to provide that multiplexing. This not only conserves logic module resources on the programmable logic device, it also reduces time delay through the circuitry performing the multiplexing (e.g., because there is generally more time delay associated with transmitting signals from logic module to logic module than is associated with the more localized signal switching performed by the circuitry shown in FIG. 1).

Figure 2:
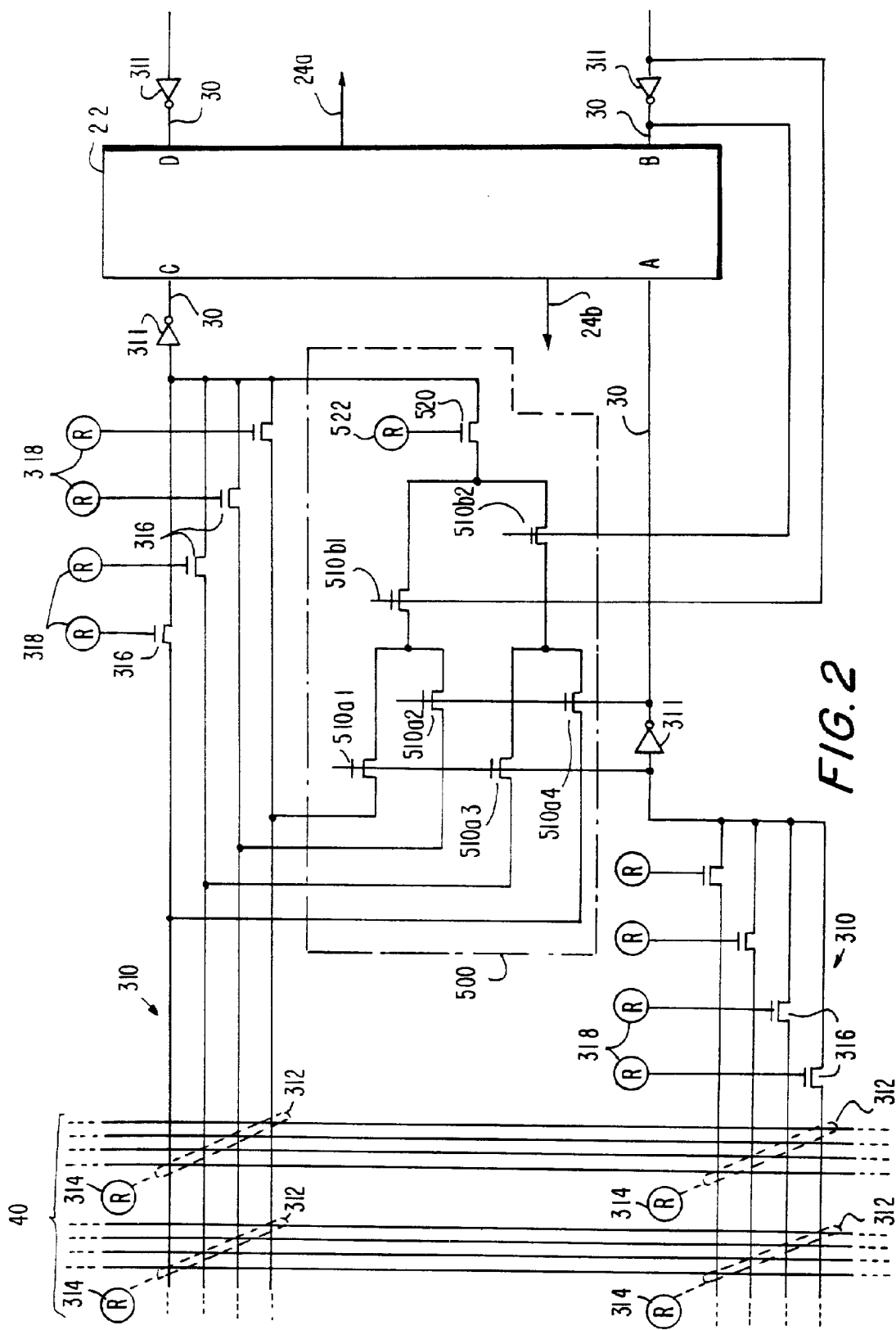
FIG. 2 is generally similar to FIG. 1, but shows an alternative embodiment of a representative portion of a programmable logic device constructed in accordance with the invention.

FIG. 2 shows an alternative embodiment of the invention. The FIG. 2 alternative is shown in the same general context as the FIG. 1 embodiment is shown in, although it will again be understood that this particular context is only illustrative and that embodiments of the type shown in FIG. 2 can be implemented in other contexts if desired. In the embodiment shown in FIG. 2 a four-to-one multiplexer circuit 500 is connected in parallel with the final input selection PLCs 316 for logic module input C. Each of the four conductors 310 associated with input C is also provided as a data input signal to multiplexer 500. Multiplexer 500 also receives the true and complement of logic module inputs A and B. These true and complement inputs control PLCs 510a1-4 and 510b1-2 to select one of the four data inputs to multiplexer 500. If multiplexer mode is selected, all of the PLCs 316 associated with the C input are turned off by their FCEs 318, and instead PLC 520 is turned on by its FCE 522. Accordingly, the one-of-four data input signals to multiplexer 500 selected by the true and complement A and B inputs is output by the multiplexer for use to supply the C input to logic module 22. If multiplexer mode is not desired, PLC 520 is turned off by FCE 522, and the C input is selected in the normal way by enabling the desired one of the PLCs 316 associated with the C input.

It should be noted that the true and complement A and B inputs can be derived from the inputs and outputs of inverters 311 that may already be provided in association with the A and B inputs of logic module 22.

To describe in more detail one example of the operation of multiplexer 500, if it is desired to have the multiplexer select the signal on the next-to-top-most conductor 310 associated with input C as the source for the C input signal, inputs A and B are both caused to be logic 1. The logic 1 value of input A enables PLCs 510a2 and 510a4, while disabling PLCs 510a1 and 510a3. The logic 1 value of input B enables PLC 510b2, while disabling PLC S10b1. The net result of this PLC 510 enabling and disabling is to pass the signal on the next-to-top-most conductor 310 associated with input C to PLC 520. In multiplexer mode PLC 520 is enabled so that the signal selected by multiplexer 500 is the source of the C input to logic module 22.

Embodiments of the type shown in FIG. 2 have the advantage that, in addition to performing a four-to-one multiplexer operation, it may also be possible to use logic module 22 to perform other logic. For example, logic module 22 can be constructed so that if desired, the logic module can derive one of its output signals 24a or 24b from its C input, while at the same time performing logic on its other inputs A, B, and D (or even on all of its inputs, including input C) to produce another of output signals 24a and 24b. An example of a logic module construction with this type of capability is shown in Pedersen et al. U.S. Pat. No. 5,835,998, which is also hereby incorporated by reference herein. In the just-mentioned Pedersen et al. logic module the C input can bypass the look-up table in the logic module and be used by itself as the signal to be registered by the logic module's flip-flop register. The output signal of the register can be selected as either output 24a or 24b of the logic module. At the same time the look-up table in the logic module can be used to perform logic on any or all of the logic module inputs A–D to produce the other output 24a or 24b. It will be appreciated, of course, that when the circuitry shown in FIG. 2 is operating in multiplexer mode, inputs A and B are somewhat constrained by their use as selection control signals for multiplexer 500.

The particular logic module construction shown in the last-mentioned Pedersen et al. reference is only an example of how logic module 22 can be constructed to output and/or utilize the output signal of four-to-one multiplexer 500, while at the same time performing other logic on inputs to the logic module. Other logic module constructions with this type of capability will occur to those skilled in the art.

As an alternative to using look-up table inputs A and B for multiplexer 500 selection control, other signals on the programmable logic device can be used for that purpose. For example, signals like S0 and S1 or X and Y, described below in connection with FIGS. 3–6, can be used for multiplexer selection control in embodiments that are otherwise as shown in FIG. 2. Similarly, a signal like S0, S, X, or Y in FIGS. 3–6 can be used instead of look-up table input D for partial multiplexer control in embodiments that are otherwise as shown in FIG. 1.

Figure 3:
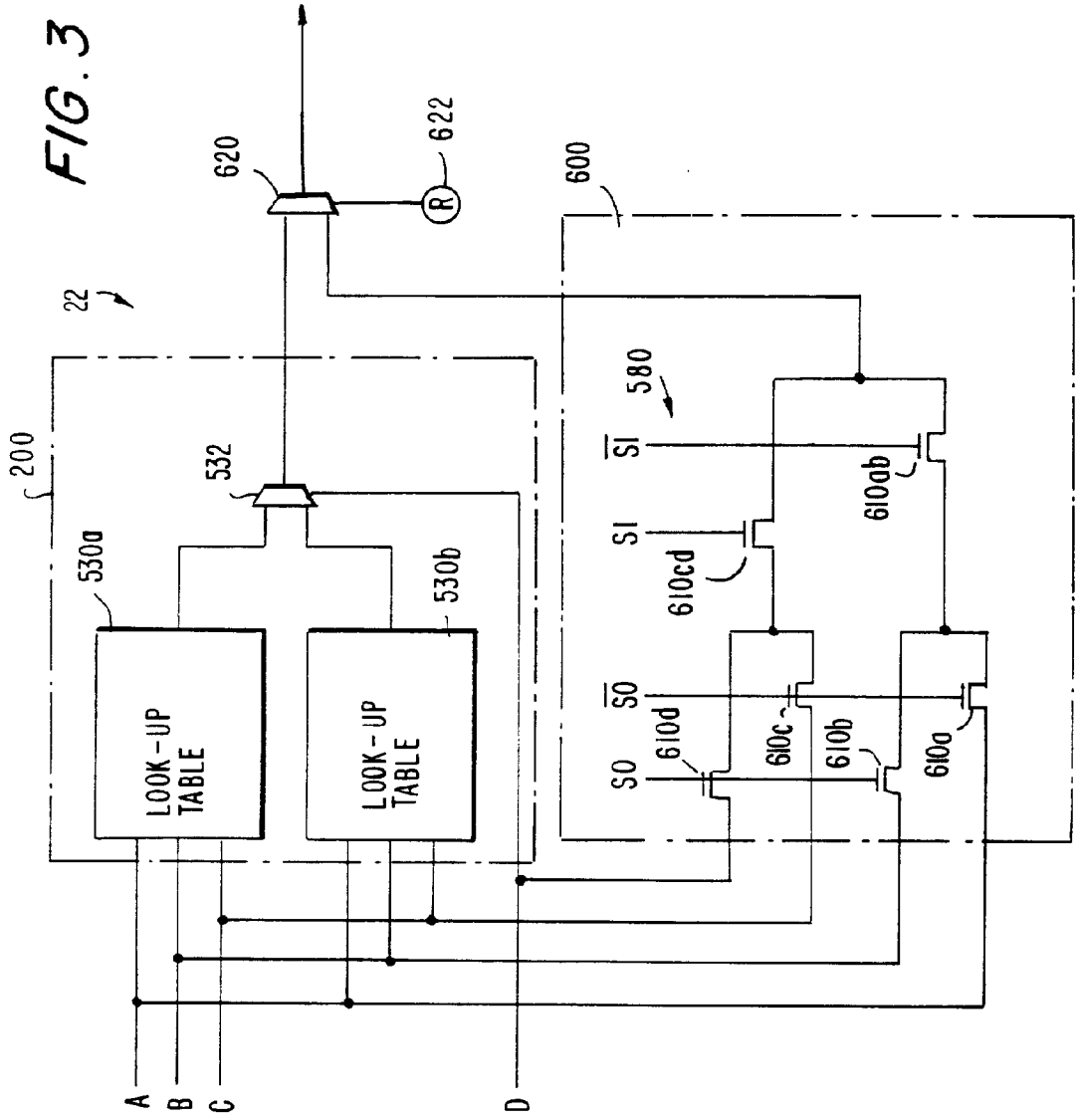
FIG. 3 is another view generally similar to FIGS. 1 and 2, but shows yet another alternative embodiment of a representative portion of a programmable logic device constructed in accordance with the invention.

In the further alternative embodiment shown in FIG. 3 logic module 22 includes a four-to-one multiplexer circuit 600 in parallel with the four-input look-up table circuitry 200 of the logic module. (Reference number 200 and the reference numbers in the 500 series in FIG. 3 are used in generally the same way that those same reference numbers are used in the last-mentioned Pedersen et al. reference. Again, however, this possible context for the circuitry of this invention is only illustrative, and other suitable contexts will be apparent to those skilled in the art.) Four-input look-up table 200 is shown in FIG. 3 as two three-input look-up tables 530a and 530b. Each of look-up tables 530 receives inputs A–C of logic module 22 and produces an output signal which is any logical combination of those three input signals. PLC 532 is controlled by logic module input signal D to select one of the two look-up table 530 output signals in order to produce a final four-input look-up table output signal which is applied to one input of PLC 620.

Within four-to-one multiplexer circuit 600 PLCs 610 are controlled by the true and complement of selection signals S0 and S1 to select one of inputs A–D for application to the other input of PLC 620. When the FIG. 3 circuitry is in normal logic mode rather than in four-to-one multiplexer mode, FCE 622 is programmed to control PLC 620 to pass the output signal of four-input look-up table 200. On the other hand, when the FIG. 3 circuitry is in four-to-one multiplexer mode, FCE 622 is programmed to control PLC 620 to pass the output signal of four-to-one multiplexer circuit 600. Similar to what is shown for signal 202 in the last-mentioned Pedersen et al. reference, the output signal of PLC 620 may be output by logic module 22 with and/or without registration by the flip-flop register of the logic module. Other logical operations may also be performed on that signal (e.g., also as in the last-mentioned Pedersen et al. reference).

The selection control signals (S0 and S1) for multiplexer circuit 600 may be any logic or control signals on the programmable logic device. In the particular example shown in FIG. 3 it is assumed that signals S0 and S1 are so-called secondary signals 580 associated with a group of adjacent logic modules which includes the depicted logic module. In other words, each of signals S0 and S1 may be a signal which is available in parallel to all of the logic modules in a group of logic modules (see FIG. 6, which is described below). For example, one of the plurality of nominal clock signals available to logic module 22 may be "borrowed" to provide one of these selection control signals, and one of a plurality of nominal clear signals available to logic module 22 may be "borrowed" to provide the other of these selection control signals.

As a specific example of the operation of multiplexer circuit 600, if that circuit is to select input C for application to PLC 620, signal SO is caused to be logic 0 (so that its complement (SO bar) will be logic 1) and signal S1 is caused to be logic 1 (so that its complement (S1 bar) will be logic 0). This combination of control signal states enables PLCs 610a, 610c, and 610cd, while disabling PLCs 610b, 610d, and 610ab. The net result of this is passage of input C through PLCs 610c and 610cd to the output of multiplexer circuit 600, while all of the other inputs to the multiplexer are blocked by the multiplexer circuitry.

Unlike embodiments of the type shown in FIG. 2, embodiments of the type shown in FIG. 3 do not allow use of the look-up table logic 200 of a logic module 22 in which the multiplexer circuit 600 is being used. For example, the FIG. 3 circuitry does not allow signal inversion as well as multiplexing. In embodiments of the type shown in FIG. 2 the multiplexer output signal can be selectively inverted by the look-up table (e.g., by using input D as an inversion control signal in the appropriately programmed look-up table in logic module 22). Alternatively, the multiplexer output signal can be always inverted by appropriately programming look-up table 22. The same capability for constant inversion of the multiplexer output signal is also available in embodiments of the type shown in FIG. 1.

Figure 4:
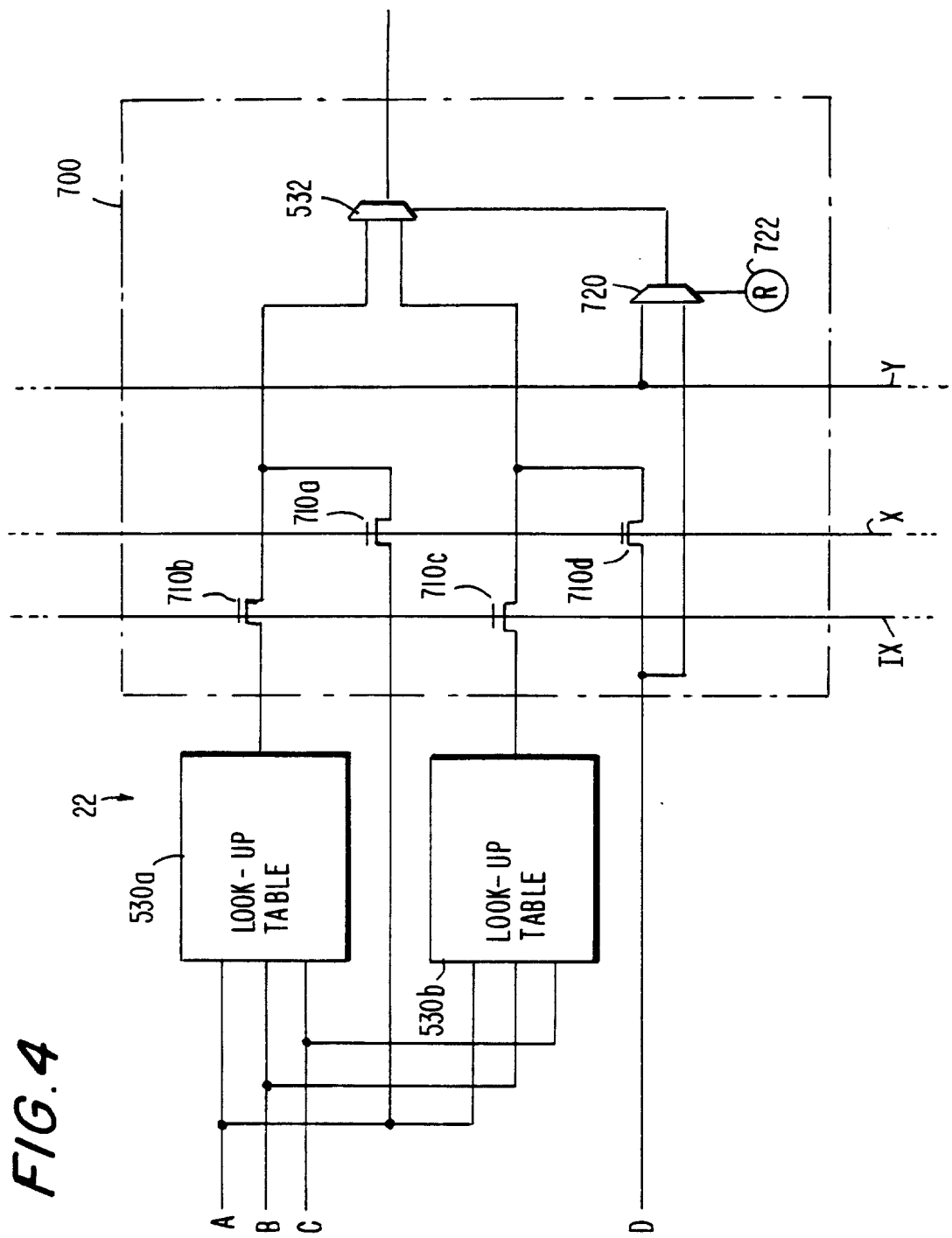
FIG. 4 is still another view generally similar to FIGS. 1–3, but shows still another alternative embodiment of a representative portion of a programmable logic device constructed in accordance with the invention.

FIG. 4 shows another illustrative embodiment, which in some respects can be considered a modification of the FIG. 3 embodiment. As in FIG. 3, the four-input look-up table of logic module 22 is shown implemented in FIG. 4 as two three-input look-up tables 530a and 530b with a final output selection PLC 532. Inputs A–C are all applied to both of look-up tables 530a and 530b. When the logic module is not being used to perform a four-to-one multiplexing operation, the signals on selection control leads IX and X (IX being the inverse of X) are caused to be such as to enable PLCs 710b and 710c and to disable PLCs 710a and 710d. In addition, FCE 722 is programmed to cause PLC 720 to output the D input to the logic module. This allows the outputs of look-up tables 530a and 530b to be applied to PLC 532 and allows input D to select which of those two look-up table output signals will be passed on to the remainder of the circuitry of logic module 22.

On the other hand, when logic module 22 is to perform a four-to-one multiplexer operation, look-up table 530a may be programmed to simply pass input B and look-up table 530b may be programmed to pass input C. FCE 722 is programmed to cause PLC 720 to pass selection control signal Y. Selection control signals IX, X, and Y then determine which of inputs A–D will be output by PLC 532. For example, if input B is to be output, IX is logic 1 (which means that X is logic 0) and Y is made whichever value causes PLC 532 to pass the upper one of its two inputs. The logic 1 value of IX enables PLCs 710b and 710c, while the logic 0 value of X disables PLCs 710a and 710d. This allows inputs B and C (output by look-up tables 530a and 530b) to be applied to PLC 532. Input B is then selected by PLC 532 as a result of Y have the value appropriate to select the signal on its upper input lead. This is just one example of how the circuitry shown in FIG. 4 can operate as a four-to-one multiplexer to select any one of inputs A–D at any time by input of the appropriate IX, X and Y signal values.

Like signals S0, S0 bar, S1, and S1 bar in FIG. 3, signals IX, X, and Y may be signals that are available to several adjacent logic modules on the device. For example, signals IX, X, and Y may be "borrowed" from available "secondary signals" (e.g., clock and clear signal conductor resources) serving several adjacent logic modules when four-to-one multiplexing is needed.

As compared to embodiments of the type shown in FIG. 3, embodiments of the type shown in FIG. 4 may be advantageous in that look-up tables 530a and 530b are available in multiplexer mode to perform some logic on at least two of the multiplexer inputs. For example, either or both of inputs B and C can be inverted by look-up tables 530.

It will be understood that, in multiplexer mode, using look-up table 530a to output a signal based on input B and using look-up table 530b to output a signal based on input C is only exemplary, and that these uses of look-up tables 530 can be reversed if desired.

Figure 5:
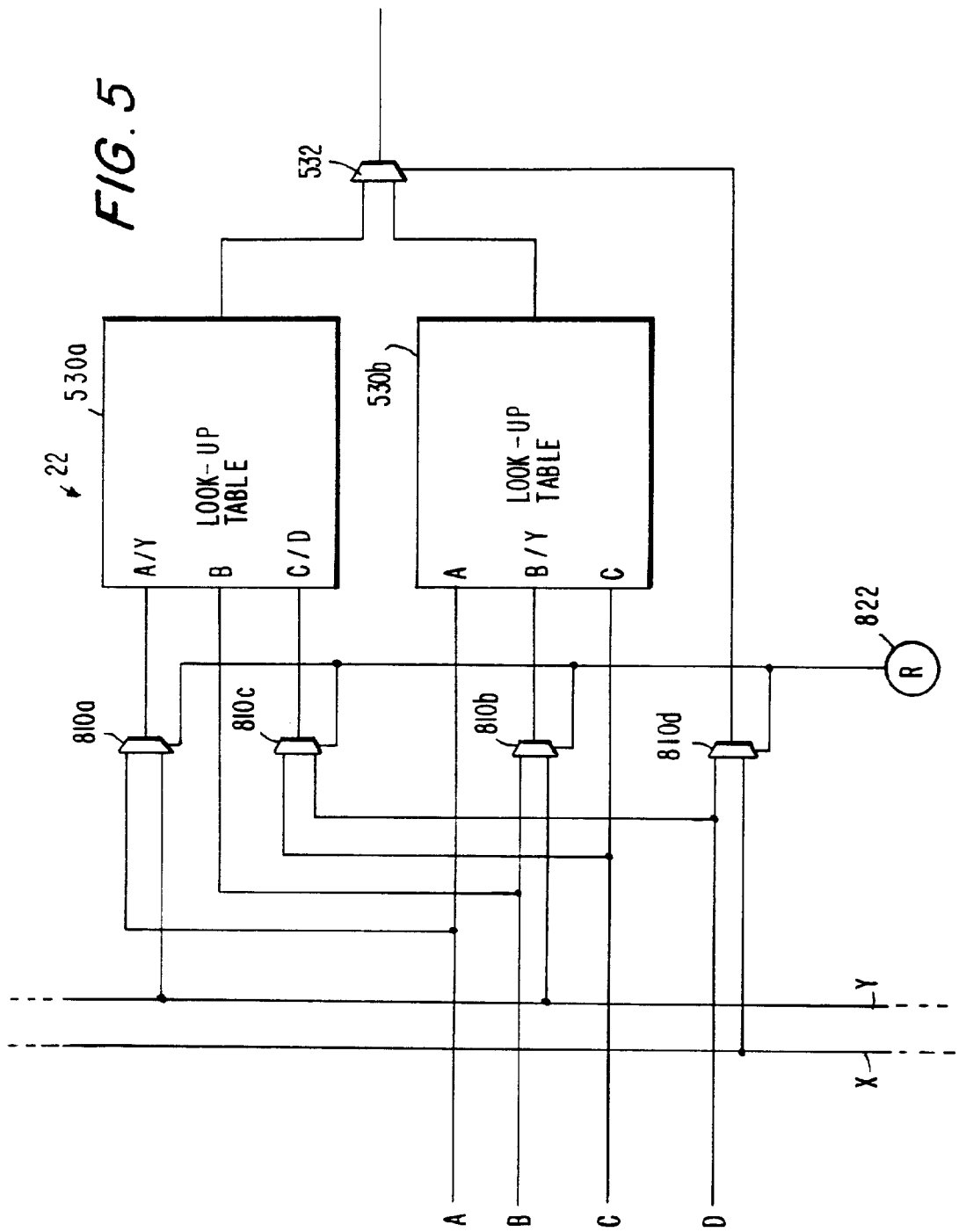
FIG. 5 is yet another view generally similar to FIGS. 1–4, but shows yet another alternative embodiment of a representative portion of a programmable logic device constructed in accordance with the invention.

FIG. 5 shows yet another illustrative embodiment. When the logic module 22 shown in part in FIG. 5 is not being used in four-to-one multiplexer mode, FCE 822 is programmed to control PLCs 810a–d so that each of those PLCs passes the upper one of its two input signals and ignores the lower one of those two input signals. Accordingly, each of three-input lookup tables 530a and 530b receives logic module inputs A, B, and C, and each look-up table can be programmed to produce an output signal which is any combination of those inputs. PLC 810d passes logic module input D, which is used to control PLC 532 to select either the output signal of look-up table 530a or the output signal of look-up table 530b as the combinatorial signal produced by the depicted portion of logic module 22. From the foregoing, it will be apparent that signals X and Y are not used in this normal logic operation of logic module 22.

When it is desired to use logic module 22 in four-to-one multiplexer mode, FCE 822 is programmed to control each of PLCs 810a–d to pass the lower one of its two input signals and to ignore the upper one of those input signals. This causes look-up table 530a to receive the signal on conductor Y rather than the A input, and to receive input D rather than input C. Similarly, look-up table 530b receives the conductor Y signal rather than input B. PLC 532 is controlled by the signal on conductor X rather than by the D input. Accordingly, look-up table 530 can be programmed as a two-input multiplexer which outputs B or D, depending on the state of signal Y. Look-up table 530b can be similarly programmed as a two-input multiplexer which outputs A or C, depending on the state of signal Y. The final selection of the output of look-up table 530a or 530b is made by PLC 532 in response to signal X.

As in the case of signals IX, X, and Y in FIG. 4, signals X and Y in FIG. 5 can be signals that serve several logic modules 22 in parallel. For example, these signals can be "borrowed" from several available secondary signals (e.g., flip-flop clock and/or clear signals) that extend to several adjacent logic modules.

Instead of simply passing through selected inputs A–D in four-to-one multiplexer mode, each of look-up tables 530a and 530b in FIG. 5 can additionally perform some logic on those inputs. For example, one or more of these inputs can be inverted by the associated look-up table 530 before being output.

Figure 6:
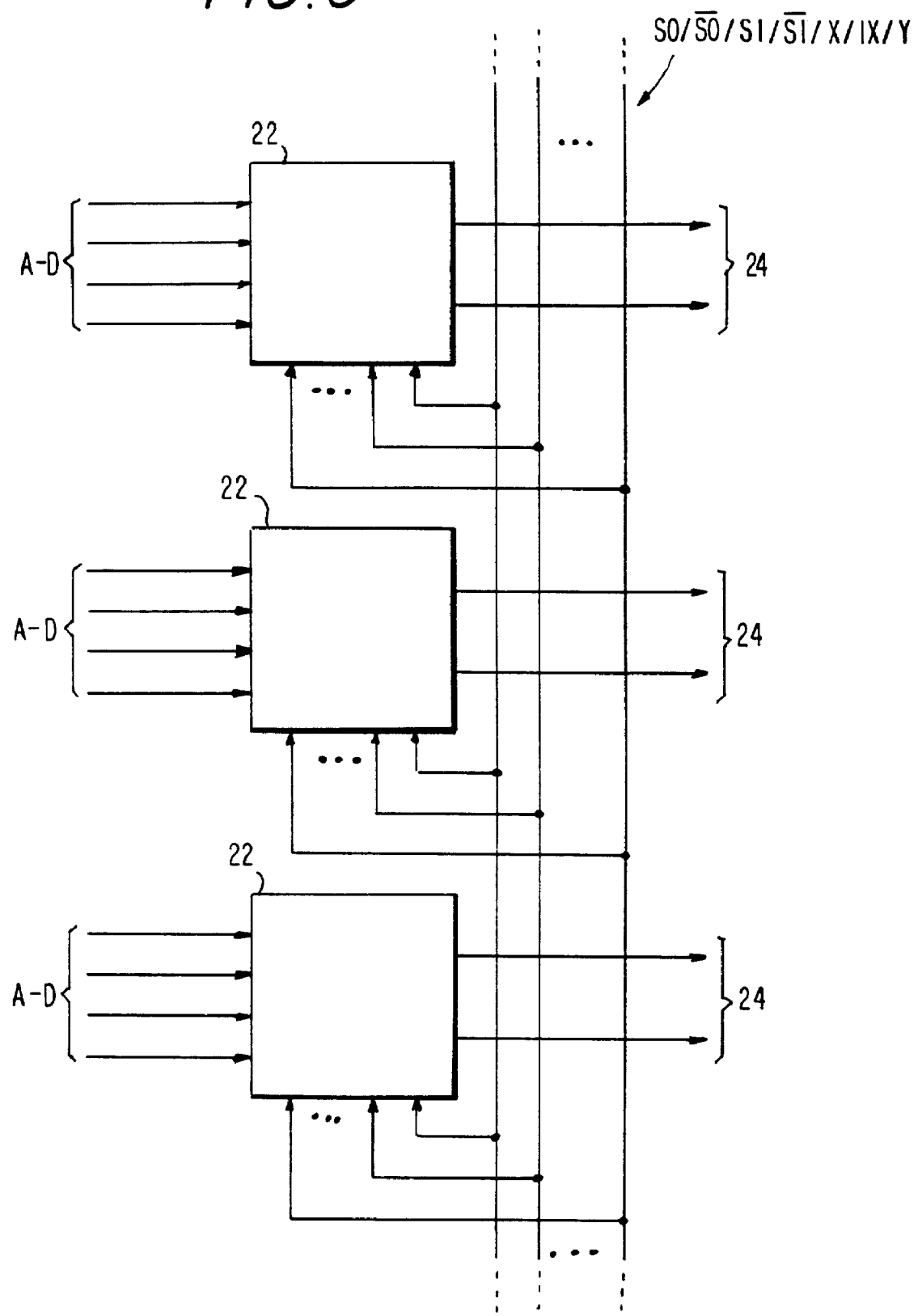
FIG. 6 is a simplified block diagram showing another representative portion of a programmable logic device constructed in accordance with the invention.

FIG. 6 illustrates the point (previously made in connection with FIGS. 3–5) that control signals like S0, S0 bar, S1, S1 bar, X, IX, and Y for several adjacent logic modules 22 on a programmable logic device can come from signal sources that are shared by those several logic modules.

As has been said, it will be understood that the term "programmable logic connector" or "PLC" is used herein to refer to connectors that can be set up or changed either when the programmable logic device is first programmed or on a more dynamic basis in response to a potentially changing data or control signal on the programmable logic device. In the case of a PLC which is set up when the programmable logic device is first programmed, the connection (and logic, if any) effected by the PLC is static. Examples of such PLCs are elements 312 in FIG. 1, those of elements 316 in FIG. 1 that are always directly controlled by FCEs 318, PLCs 410 in FIG. 1, PLC 620 in FIG. 3, and the like. Examples of PLCs that are dynamically controlled by data or control signals on the programmable logic device are those of elements 316 in FIG. 1 that are controlled by the outputs of PLCs 410, PLCs 510 in FIG. 2, PLCs 532 and 610 in FIG. 3, PLCs 532 and 710 in FIG. 4, and PLC 532 in FIG. 5.

FIG. 7 illustrates a programmable logic device 10 (which includes logic modules 22 in accordance with this invention) in a data processing system 900. In addition to device 10, data processing system 900 may include one or more of the following components: a processor 904; memory 906; I/O circuitry 908; and peripheral devices 910. These components are coupled together by a system bus 920 and are populated on a printed circuit board 930 which is contained in an end-user system 940.

System 900 can be used in a wide variety of applications, such as computer networking, data networking, instrumentation, video processing, digital signal processing, or any other application where the advantage of using reprogrammable logic is desirable. Programmable logic device 10 can be used to perform a variety of different logic functions. For example, programmable logic device 10 can be configured as a processor or controller that works in cooperation with processor 904. Programmable logic device 10 may also be used as an arbiter for arbitrating access to a shared resource in system 900. In yet another example, programmable logic device 10 can be configured as an interface between processor 904 and one of the other components in system 900. It should be noted that system 900 is only exemplary, and that the true scope and spirit of the invention should be indicated by the following claims.

The PLCs mentioned throughout this specification (which includes the appended claims) can be implemented in any of a wide variety of ways. For example, each PLC can be a relatively simple programmable connector such as a switch or a plurality of switches for connecting an input or any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMS, EEPROMs, pass transistors, transmission gates, antifuses, laser fuses, metal optional links, etc. The components of PLCs can be controlled dynamically by data or control signals on the device or more statically by various, programmable, function control elements ("FCEs"), which are not always shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like.

From the various examples mentioned above it will be seen that this invention is applicable both to one-time-only programmable devices and to reprogrammable devices.

It will be understood that the foregoing is only illustrative of the principles of the invention, and that various modifications can be made by those skilled in the art without departing from the scope and spirit of the invention. For example, although particular ones of look-up table inputs A–D are shown receiving particular signals in FIGS. 1–5, it will be understood that there may be some variation in which signals are applied to which of the look-up table inputs.

The invention claimed is:

1. A multi-mode programmable logic module for use in a programmable logic device, comprising circuitry that is configured to:
   have a plurality of modes of operation that are programmably selectable and which share a conductor for applying an output signal for each mode, the plurality of modes including an enhanced multiplexer mode of operation and a logic mode of operation;
   have input signals that are programmably selected to be applied to the circuitry for each mode from signals on a plurality of conductors;
   operate as a look-up table whose output signal is any of a plurality of logical combination of at least four input signals when the logic mode of operation for the module has been selected; and
   operate as a four-to-one multiplexer whose output signal is derived from any of one of four input signals that is dynamically selectable using other input signals when the enhanced multiplexer mode of operation for the module has been selected.

2. The programmable logic module defined in claim 1 wherein the plurality of logical combinations includes substantially any logical combination of the four input signals thus logically combined.

3. The programmable logic module defined in claim 1 wherein the other input signals applied to the circuitry are two in number.

4. The programmable logic module defined in claim 1 further comprising:
   a programmable function control element for controlling whether the circuitry operates to produce an output signal which is a logical combination of four input signals applied to the circuitry or a signal derived from any one of four input signals applied to the circuitry and selected by other input signals applied to the circuitry.

5. The programmable logic module defined in claim 1 wherein the circuitry comprises:
   a four-input look-up table circuit which is programmable to produce the output signal as any logical combination of four main input signals applied to the look-up table circuit; and
   preliminary selection circuits configured to select at least one of the main input signals from a plurality of the input signals applied to the circuitry based on at least one of further ones of the input signals applied to the circuitry.

6. The programmable logic module defined in claim 1 wherein the circuitry further comprises:
   programmable logic connector componentry configured to programmably selectively enable the preliminary selection circuits to respond to the at least one of the further ones of the input signals to the circuitry.

7. The programmable logic module defined in claim 6 wherein the programmable logic connector componentry is further configured to allow the preliminary selection circuits to alternatively respond to programmable function control elements.

8. The programmable logic module defined in claim 5 wherein the at least one of the further ones of the input signals also serves as one of the main input signals applied to the look-up table circuit.

9. The programmable logic module defined in claim 8 wherein the preliminary selection circuits comprise:

a first preliminary selection circuit configured to select a first of the main input signals from a first two of the input signals applied to the circuitry based on the at least one of the further ones of the input signals applied to the circuitry; and a second preliminary selection circuit configured to select a second of the main input signals from a second two of the input signals applied to the circuitry based on the at least one of the further ones of the input signals applied to the circuitry.

10. The programmable logic module defined in claim 8 wherein the preliminary selection circuits comprise:

a circuit configured to select a first of the main input signals from four of the input signals applied to the circuitry based on two of the further ones of the input signals applied to the circuitry.

11. The programmable logic module defined in claim 10 wherein each of the two of the further ones of the input signals also serves as a respective one of second and third ones of the main input signals.

12. The programmable logic module defined in claim 1 wherein the circuitry comprises:

a four-input look-up table circuit which is programmable to produce a first intermediate output signal which is any of a plurality of logical combinations of four of the input signals applied to the circuitry and received by the four-input look-up table circuit;

a four-input multiplexer circuit configured to derive a second intermediate output signal from a selected one of the four input signals that are received by the look-up table, the multiplexer circuit selecting the selected one based on the other input signals applied to the circuitry; and an output connector for selecting either the first intermediate output signal or the second intermediate output signal as the output signal.

13. The programmable logic module defined in claim 12 wherein the output connector is programmably controlled.

14. A programmable logic device having a plurality of logic modules each as defined in claim 12, wherein the other input signals applied to the circuitry of each of the logic modules are the same signals for all of the logic modules in the plurality of logic modules.

15. The programmable logic module defined in claim 1 wherein the circuitry comprises:

a first three-input look-up table circuit which is programmable to produce a first output signal which is any of a plurality of logical combinations of three of the input signals applied to circuitry and received by the first look-up table circuit;

a second three-input look-up table circuit which is programmable to produce a second output signal which is any of a plurality of logical combinations of the three input signals received by the first look-up table circuit and also received by the second look-up table circuit; and a four-input multiplexer circuit configured to derive the output signal from a selected one of the first and second output signals, one of the three input signals received by the first and second look-up table circuits, and a further one of the input signals applied to the circuitry.

16. The programmable logic module defined in claim 15 wherein the multiplexer circuit is configured to select the selected one based on the other input signals applied to the circuitry.

17. A programmable logic device having a plurality of logic modules each as defined in claim 16, wherein the other input signals applied to the circuitry of each of the logic modules are the same signals for all of the logic modules in the plurality of the logic modules.

18. The programmable logic module defined in claim 16 further comprising:

a programmable logic connector for programmably selectively substituting the further one of the input signals applied to the circuitry for one of the other input signals on which the multiplexer circuit bases selection of the selected one.

19. The programmable logic module defined in claim 1 wherein the circuitry comprises:

a first three-input look-up table circuit which is programmable to produce a first output signal which is any of a plurality of logical combinations of three main inputs to the first look-up table;

a second three-input look-up table circuit which is programmable to produce a second output signal which is any of a plurality of logical combinations of three main inputs to the second look-up table;

an output selection circuit configured to select either the first output signal or the second output signal as the output signal based on an output selection control signal;

preliminary selection circuits configured to programmably select at least one of the main input signals of each of the first and second look-up table circuits from one of the input signals applied to the circuitry or from one of the other signals applied to the circuitry; and further preliminary selection circuits configured to programmably select the output selection control signal from one of the input signals applied to the circuitry or from one of the other signals applied to the circuitry.

20. The programmable logic module defined in claim 19 wherein the preliminary and further preliminary selection circuits are controlled in parallel by a common programmable function control element.

21. A programmable logic device having a plurality of logic modules each as defined in claim 19, wherein the other input signals applied to the circuitry of each of the logic modules are the same signals for all of the logic modules in the plurality of logic modules.

22. A programmable logic device including a logic module as defined in claim 1.

23. A digital processing system comprising:

processing circuitry;

a memory coupled to said processing circuitry; and a programmable logic device as defined in claim 22 and coupled to the processing circuitry and the memory.

24. A printed circuit board on which is mounted a programmable logic device as defined in claim 22.

25. The printed circuit board defined in claim 24 further comprising:

a memory mounted on the printed circuit board and coupled to the memory circuitry.

26. The printed circuit board defined in claim 24 further comprising:

processing circuitry mounted on the printed circuit board and coupled to the memory circuitry.

27. A programmable logic device comprising:

more than four input conductors;

a logic module having four inputs comprising a first input, second input, third input, and fourth input that from the input conductors, and the logic module being configured to have an output that is from one of the first and second inputs based on the third input; and circuitry that selects two of the input conductors and that electrically connects one of the first and second inputs of the logic module to one of the selected input conductors based on the fourth input.

28. A programmable logic device comprising:

a logic module having four inputs; and circuitry that selects two of four conductors to apply signals on the two selected conductors to a respective one of two of the four inputs, and has an electrical connection to a third one of the four inputs for controlling which two of the four conductors are being selected, wherein the logic module is configured to have an output for output signals that are selected by a fourth one of the four inputs to be from one of the two inputs that have signals from the two selected conductors.

29. The device of claim 28 wherein the logic module is a programmable logic module.

30. The device of claim 28 wherein the circuitry includes four multiplexer circuits that are controlled to select two of the four conductors.

31. The device of claim 30 wherein each of the four multiplexer circuits has one input that has an electrical connection to the third one of the four inputs.

32. The device of claim 31 wherein the circuitry includes a function control element circuit that controls the multiplexer circuits.

33. The device of claim 32 wherein each of the multiplexer circuits controls a respective one of four programmable logic connector circuits, and each of the programmable logic connector circuits selectively applies signals on one of the four conductors to a respective one of the four inputs.

34. A programmable logic device comprising:

more than four input conductors;

a logic module having at least two inputs and one control input coupled to the more than four input conductors; and circuitry that selects an output from the at least two inputs in response to the control input.

35. A programmable logic device comprising:

a logic module having four inputs; and circuitry that selects one of four conductors to apply signals on the selected conductor to one of the four inputs, and has an electrical connection to two more of the four inputs for controlling which one of the four conductors is being selected.

36. The device of claim 35 wherein one of the electrical connections is to select two of the four conductors.

37. The device of claim 36 wherein the other electrical connection is to select one of the selected two conductors.

38. The device of claim 35 wherein the circuitry applies signals on the selected conductor to a first one of the four inputs, and the device further comprises four function control element circuits that are programmable to selectively apply signals on a respective one of the four conductors to that first input.

39. The device of claim 38 wherein the circuitry includes another function control element circuit that is programmable to select to apply signals on the selected conductor to the first input.

40. A programmable logic device comprising:

four input conductors;

a programmable look-up table circuit that has four inputs that are from the four input conductors and that is a part of a programmable logic module that is in a group of programmable logic modules;

a plurality of other conductors that are available to the modules in the group of programmable logic modules;

a multiplexer circuit that has four inputs that are from the four conductors, and has other inputs that control the multiplexer that are from the other conductors; and circuitry that selects a device output to be from the multiplexer or the look-up table circuit.

41. A programmable logic device comprising:

a programmable look-up table circuit that is part of a programmable logic module that is in a group of programmable logic modules, and that has four inputs that are respectively from four conductors;

a multiplexer circuit that has four inputs that are to receive signals from a respective one of the four conductors, and that is controlled by a plurality of signals that are available in parallel to each of the modules in the group of programmable logic modules; and circuitry that selects output signals of the device to be from the multiplexer or the look-up table circuit.

42. The programmable logic device of claim 41 wherein the multiplexer circuit includes a selection circuit comprising:

two programmable logic connectors that are to receive signals from a respective one of two of the four conductors; and an additional programmable logic connector that is to receive signals from the two programmable logic connectors.

43. The programmable logic device of claim 42 wherein the multiplexer circuit comprises two selection circuits.

44. The programmable logic device of claim 43 wherein the circuitry is to receive signals from the two selection circuits.

45. A programmable logic device comprising:

two three-input programmable look-up table circuits that have inputs from three input conductors; and circuitry that has four inputs that are from an additional input conductor, the look-up table circuits, and a particular one of the three input conductors, and that is configured to have an output that is selected to be from its four inputs.

46. A programmable logic device comprising:

two programmable look-up table circuits that each have three inputs that are respectively from the same three conductors; and circuitry that has an output which is selected to be from a given one of the three conductors, one of the two look-up table circuits, or a fourth conductor.

47. The device of claim 46 wherein the two programmable look-up table circuits are part of a programmable logic module in a group of programmable logic modules.

48. The device of claim 47 wherein the circuitry is controlled with secondary input signals of the programmable logic module.

49. The device of claim 48 wherein the secondary input signals are signals that are available in parallel to each of the modules in the group of programmable logic modules.

50. The device of claim 46 wherein the circuitry includes a first selection circuit that selectively passes signals from one look-up table circuit or the given one of the conductors.

51. The device of claim 50 wherein the circuitry includes a second selection circuit that selectively passes signals from the other look-up table circuit or the fourth conductor.

52. The device of claim 51 wherein the circuitry includes a programmable logic connector circuit that selectively passes signals from the first selection circuit or the second selection circuit.

53. A programmable logic module in a group of programmable logic modules, comprising:

four input conductors;

two other conductors that are available to the modules in the group of programmable logic modules;

logic circuitry that has seven inputs and an output, and that comprises:

two three-input look-up table circuits that together have six of the inputs, and a switch circuit that has the seventh input and that selects the output to be from one of the two look-up table circuits based on the seventh input; and preliminary selection circuitry that selects to electrically connect the other conductors to three of the inputs of the logic circuitry to control the output of the logic circuitry to be from one of the other four inputs of logic circuitry.

54. A programmable logic module comprising:

logic circuitry that has seven data inputs, and that includes:

two look-up table circuits that each have three of the data inputs, and a switch circuit that has another one of the data inputs and which has an output that is from one of the two look-up table circuits; and selection circuitry that selectively connects signals that are for a plurality of secondary inputs of the module to three of the seven data inputs for selecting the output to be from which one of the remaining four data inputs.

55. The module of claim 54 wherein the module is one of a group of programmable logic modules and the signals that are for the plurality of secondary inputs are signals that are available in parallel to each of the modules in the group of modules.

56. The module of claim 54 wherein the selection circuitry selectively connect signals for one of the secondary inputs to one of the data inputs of each of the lookup table circuits.

57. The module of claim 54 wherein the output of the switch circuit is controlled by the data input of the switch circuit.

58. The module of claim 57 wherein the selection circuitry selectively connects signals from one of the secondary inputs to the data input of the switch circuit.

* * * * *